US006967880B2

(12) United States Patent
Park

(10) Patent No.: US 6,967,880 B2
(45) Date of Patent: Nov. 22, 2005

(54) SEMICONDUCTOR MEMORY TEST DEVICE

(75) Inventor: Kee Teok Park, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 501 days.

(21) Appl. No.: 10/236,313

(22) Filed: Sep. 6, 2002

(65) Prior Publication Data

US 2003/0116786 A1     Jun. 26, 2003

(30) Foreign Application Priority Data

Dec. 21, 2001   (KR) ............................ 2001-0082339

(51) Int. Cl.$^7$ ............................................. G11C 29/00
(52) U.S. Cl. ................. 365/201; 365/230.06; 365/205
(58) Field of Search ........................... 365/201, 130.06, 365/205, 230.06

(56) References Cited

U.S. PATENT DOCUMENTS

| 5,381,373 | A | * | 1/1995 | Ohsawa ....................... 365/201 |
| 5,638,331 | A |   | 6/1997 | Cha et al. |
| 5,852,581 | A |   | 12/1998 | Beffa et al. |
| 5,886,944 | A | * | 3/1999 | Ahn ....................... 365/230.06 |
| 5,898,629 | A |   | 4/1999 | Beffa et al. |
| 6,031,773 | A |   | 2/2000 | Taylor |
| 6,055,199 | A |   | 4/2000 | Hamade et al. |
| 6,233,185 | B1 |  | 5/2001 | Beffa et al. |
| 6,266,286 | B1 |  | 7/2001 | Cho et al. |
| 6,551,846 | B1 | * | 4/2003 | Furutani et al. ............... 438/17 |

FOREIGN PATENT DOCUMENTS

| JP | 60157250 | 8/1985 |
| JP | 4163785 | 6/1992 |
| JP | 5325547 | 12/1994 |

* cited by examiner

Primary Examiner—Huan Hoang
(74) Attorney, Agent, or Firm—Marshall, Gerstein & Borun LLP

(57) ABSTRACT

A semiconductor memory test device is capable of reducing the test time and increasing test reliability by applying an effective stress in a burn-in level or a wafer level. The semiconductor memory test device controls a sense amplifier using an additional sense amplifier driving signal when a 2rb pattern stress is applied. Therefore, the semiconductor memory test device applies a uniform stress by applying the constant supply voltage to a cell corresponding to the entire wordlines.

9 Claims, 16 Drawing Sheets

SEMICONDUCTOR MEMORY TEST DEVICE

BACKGROUND

1. Technical Field

The present invention relates to a semiconductor memory test device and, more particularly, to a semiconductor memory test device in which uniform stress can be applied at a constant voltage to cells corresponding to entire wordlines.

2. Description of the Prior Art

The 2rb pattern stress represents a mode in which each of a pair of wordlines is alternately driven in a burn-in test. For example, wordlines WL0-WL7 can be classified into a unit pair of the wordlines (WL0, WL1), (WL2, WL3), (WL4, WL5) and (WL6, WL7), respectively. An enable state of this unit pair will be below explained. First, the wordlines (WL2, WL3) and (WL6, WL7) are disabled when the wordlines (WL0, WL1) and (WL4, WL5) are enabled, and the wordlines (WL0, WL1) and (WL4, WL5) are disabled when the wordlines (WL2, WL3) and (WL6, WL7) are enabled.

FIG. 1 is a block diagram of a conventional burn-in stress apparatus. A main wordline (mwl) is connected to a sub X-decoder 10 and the sub X-decoder 10 is also connected to a plurality of sub-wordlines wl0-wl7. A sub-hole 40 outputs eight wordline driver driving select signals (px<0:7>) to the sub X-decoder 10. A test mode decoder 20 decodes an input signal to produce an even wordline driving signal (even), an odd wordline driving signal (odd), the entire wordline driving signal (all), wordline driving signals (2rbe_with sa and 2rbo_with sa) and a normal sense amplifier enable signal (nsae) to a sense amplifier control unit 30. The sense amplifier control unit 30 outputs an inverted wordline driver driving select signal (pxz<0:7>), an inverted bit line equalizer signal (bleqz), a sense amplifier pull-up driving signal (rto) and an inverted sense amplifier pull-down driving signal (sz) to the sub-hole 40, depending on each of the signals received from the test mode decoder 20. A plurality of sense amplifiers 50 each sense and amplify data applied to bit lines bl, bl depending on a bit line equalizer signal (bleq), an inverted sense amplifier pull-up driving signal (rtoz) and a sense amplifier pull-down driving signal(s) from the sub-hole 40.

FIG. 2 is a detailed circuit diagram of the sense amplifier control unit in FIG. 1. An X-decoder 31 decodes an even wordline driving signal (even), an odd wordline driving signal (odd), the entire wordline driving signal (all) and a wordline driving signals (2rbe_with sa and 2rbo_with sa), which are received from the test mode decoder 20, to produce an inverted wordline driver driving select signal (pxz<0:7>) to the sub-hole 40. Also, a sense amplifier driving unit 32 outputs an inverted bit line equalizer signal (bleqz), a sense amplifier pull-up driving signal (rto), and an inverted sense amplifier pull-down driving signal (sz), for controlling the sense amplifier 50, to the sub-hole 40, depending on the wordline driving signals (2rbe_with sa and 2rbo_with sa) and the normal sense amplifier enable signal (nsae).

FIG. 3 is a detailed circuit diagram of the sense amplifier-driving unit 32 in FIG. 2. The sense amplifier driving unit 32 includes a NOR gate NOR1 for NORing the wordline driving signals (2rbe_with sa and 2rbo_with sa), and an inverter IV1 for inverting the normal sense amplifier enable signal (nsae). A NAND gate ND1 NANDs the output signals of the NOR gate NOR1 and the inverter IV1 and outputs a sense amplifier driving signal (sae). Inverters IV2 and IV3 delay the sense amplifier driving signal (sae), and then the inverter IV3 output an inverted bit line equalizer signal (bleqz). Inverters IV4 and IV5 delay the sense amplifier driving signal (sae), and then the inverter IV5 outputs a sense amplifier pull-up driving signal (rto). An inverter IV6 inverts the sense amplifier driving signal (sae) to produce an inverted sense amplifier pull-down driving signal (sz).

An operating procedure of the conventional burn-in stress apparatus having this structure is described below with reference to FIGS. 4–7.

In a process of manufacturing a general dynamic random access memory (DRAM), a method by which an artificial stress is applied between cell-to-cell, line-to-line and node-to-node at a high temperature burn-in mode in order to verify reliability and secure the quality is usually employed. One of the artificial stresses used is a 2rb pattern stress.

FIGS. 4–7 illustrate a process of applying stress in this 2rb pattern stress method, which includes enabling the wordlines WL by two and driving the sense amplifier so that HIGH or LOW signals are applied to corresponding cells and stress is applied between neighboring nodes.

FIG. 4 shows a case in which the even wordline-driving signal (even) is enabled and the sense amplifier driving signal (sae) is not outputted from the sense amplifier-driving unit 32. If the sense amplifier driving signal (sae) is disabled, the sense amplifier pull-up driving signal (rto) becomes HIGH, the inverted sense amplifier pull-down driving signal (sz) becomes LOW, and the bit line precharge signal (blp) and the bit line equalizer signal (bleq) become HIGH. At this time, the even (0, 2, 4, 6) wordlines WL0, WL2, WL4 and WL6 are selected and the bit line precharge voltage (Vblp) becomes LOW.

FIG. 5 shows a case in which the odd wordline-driving signal (odd) is enabled and the sense amplifier driving signal (sac) is not outputted from the sense amplifier-driving unit 32. In this case, the odd (1, 3, 5, 7) wordlines WL1, W13, WL5 and WL7 are selected and the bit line precharge voltage (Vblp) becomes HIGH.

FIG. 6 shows a case in which the wordline driving signal (2rbe) is enabled and the sense amplifier driving signal (sac) is outputted from the sense amplifier-driving unit 32. Also, the 2rbe wordlines WL0, WL1, WL4 and WL5 are enabled by the wordline driving signal (2rbe). At this time, if the sense amplifier driving signal (sac) is enabled to HIGH, the sense amplifier is driven to write HIGH and LOW into the bit lines bl, /bl, respectively, corresponding to the 2rbe wordlines WL0, WL1, WL4 and WL5 and a stress is applied to corresponding nodes via the bit lines bl, /bl for a predetermined time.

FIG. 7 shows a case in which the wordline driving signal (2rbo) is enabled and the sense amplifier driving signal (sac) is outputted from the sense amplifier-driving unit 32. Also, the 2rbo wordlines WL2, WL3, WL6 and WL7 are enabled by the wordline driving signal (2rbo). At this time, if the sense amplifier driving signal (sac) is enabled to HIGH, the sense amplifier is driven to write HIGH and LOW into the bit lines bl, /bl, respectively, corresponding to the 2rbo wordlines WL2, WL3, WL6 and WL7 and apply a stress to corresponding nodes via the bit lines bl, /bl for a predetermined time. An operating timing of the conventional burn-in stress apparatus is shown in FIG. 8.

However, this type of a conventional burn-in stress apparatus applies a stress to cell-to-cell, storage node contact (snc)-to-snc and snc-to-cell, while selectively enabling the wordlines corresponding to the wordline driving signals (2rbe and 2rbo).

At this time, the conventional burn-in stress apparatus enables the wordlines WL by dividing it into two units using the wordline driving signals (2rbe and 2rbo) and drives the sense amplifier. Therefore, there is a problem that the test time increases and a portion of the device is partially over-stressed and another portion of the device is relatively under-stressed.

SUMMARY

The disclosed apparatus may include a test mode decoder for decoding an inputted address signal and outputting a wordline driving signal and a sense amplifier driving signal. The disclosed apparatus may also include a driving unit for controlling said sense amplifier depending on said sense amplifier driving signal and being enable all the wordlines when said sense amplifier is enabled.

In another embodiment, the disclosed device may include a test mode decoder for decoding inputted address signals and outputting wordline driving signal and a sense amplifier driving signal; a sense amplifier control unit for decoding the wordline driving signal, outputting a wordline driver driving select signal, and enabling all the wordlines when said sense amplifier is enabled depending on said sense amplifier driving signal and a sub-hole for inverting the wordline driver driving select signal and the sense amplifier control signal. The device may also include a sub X-decoder for enabling a selected wordline depending on the wordline driver driving select signal and a sense amplifier enabled depending on the sense amplifier control signal.

DETAILED DESCRIPTION

Figure 1:
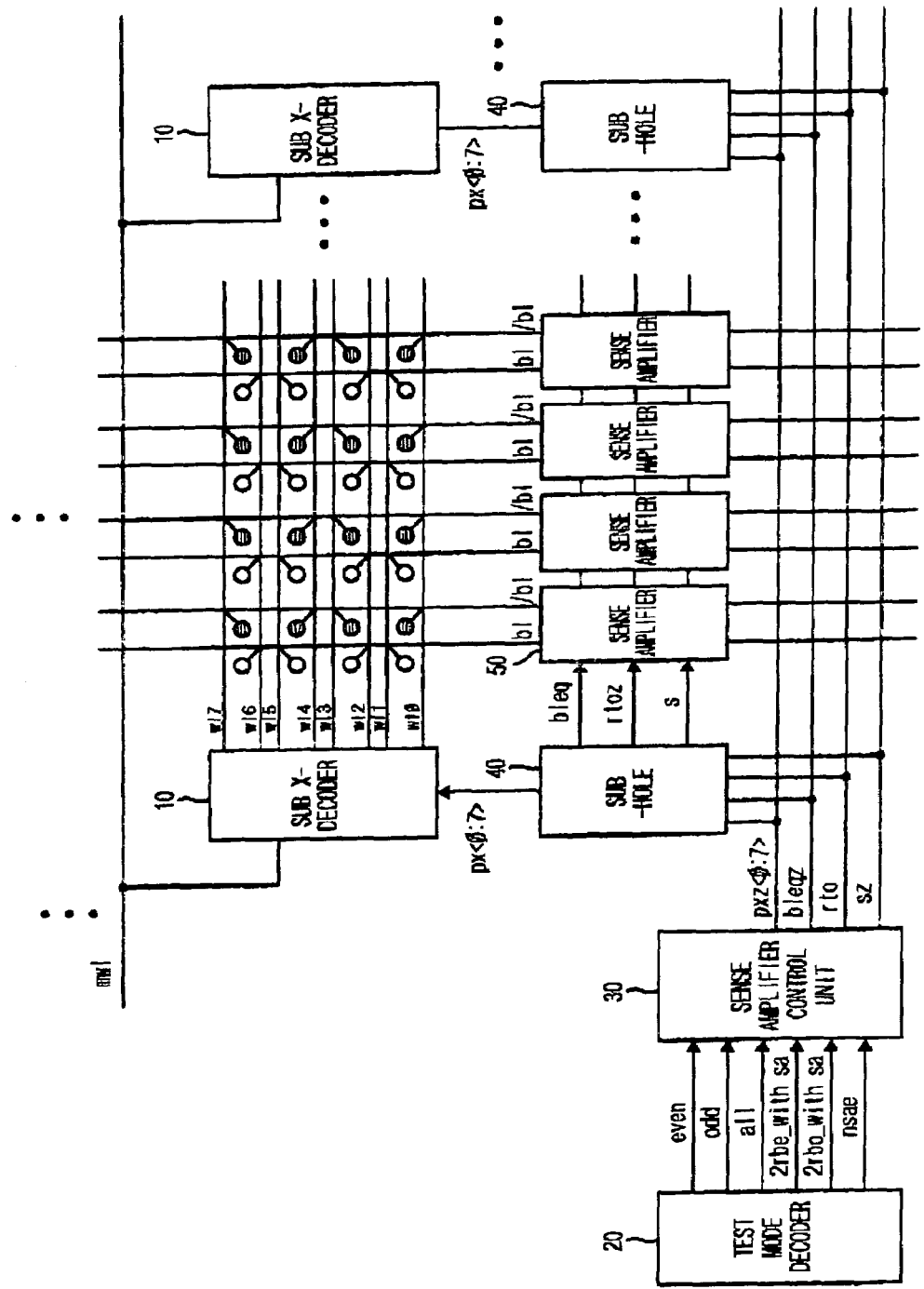
FIG. 1 is a block diagram illustrating a conventional burn-in stress apparatus.
Figure 2:
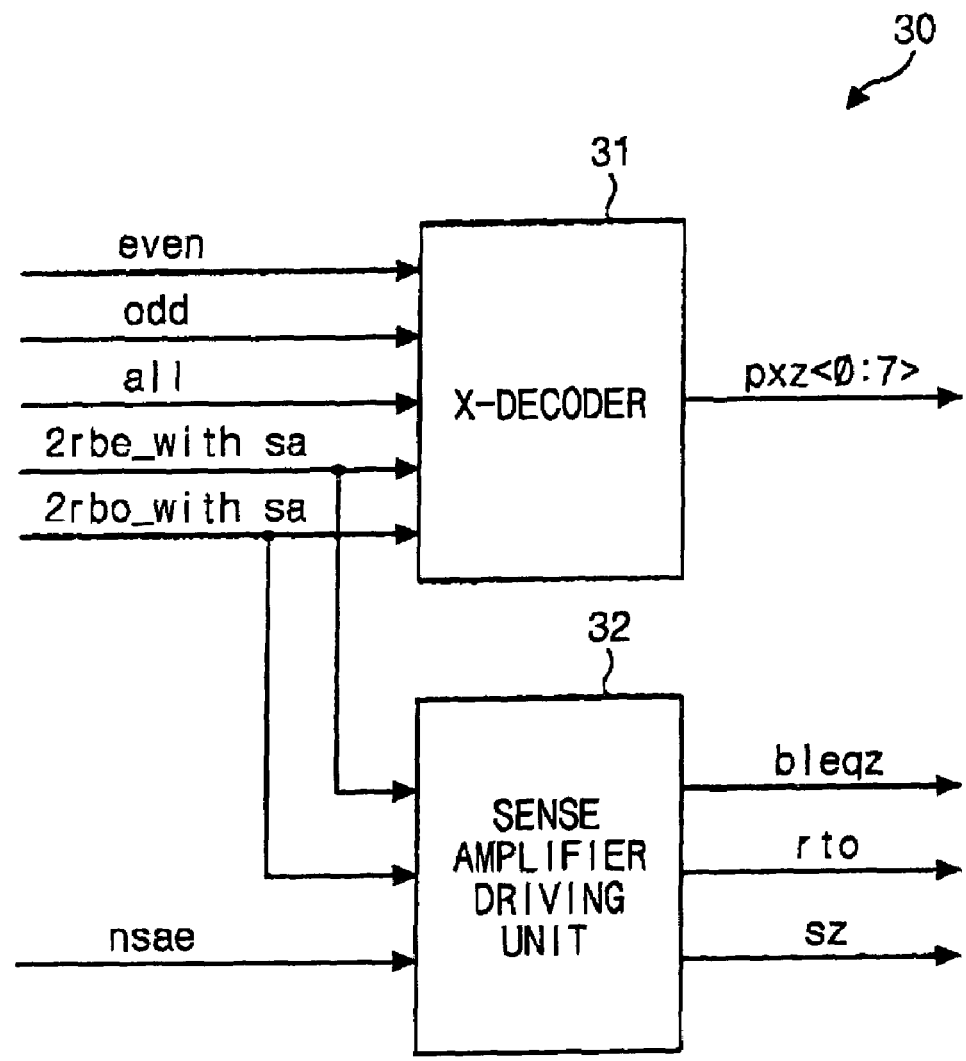
FIG. 2 is a detailed circuit diagram illustrating a sense amplifier control unit in FIG. 1.
Figure 3:
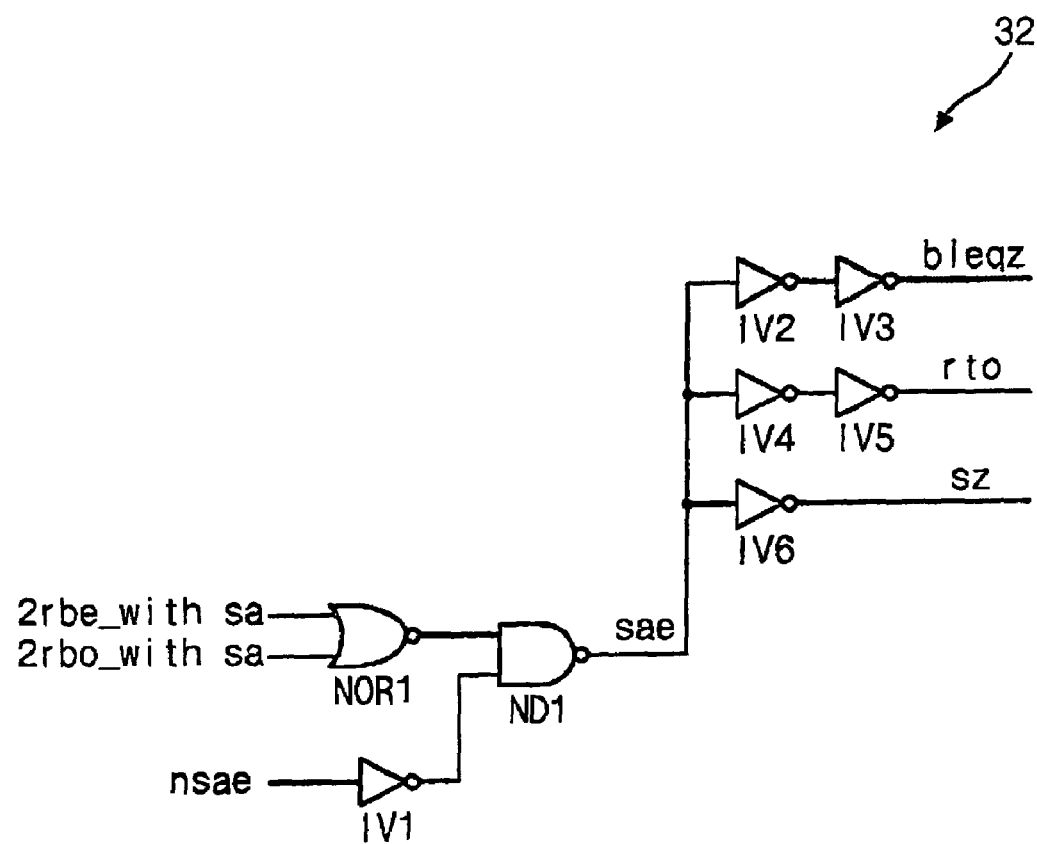
FIG. 3 is a detailed circuit diagram illustrating a sense amplifier-driving unit in FIG. 2.
Figure 4:
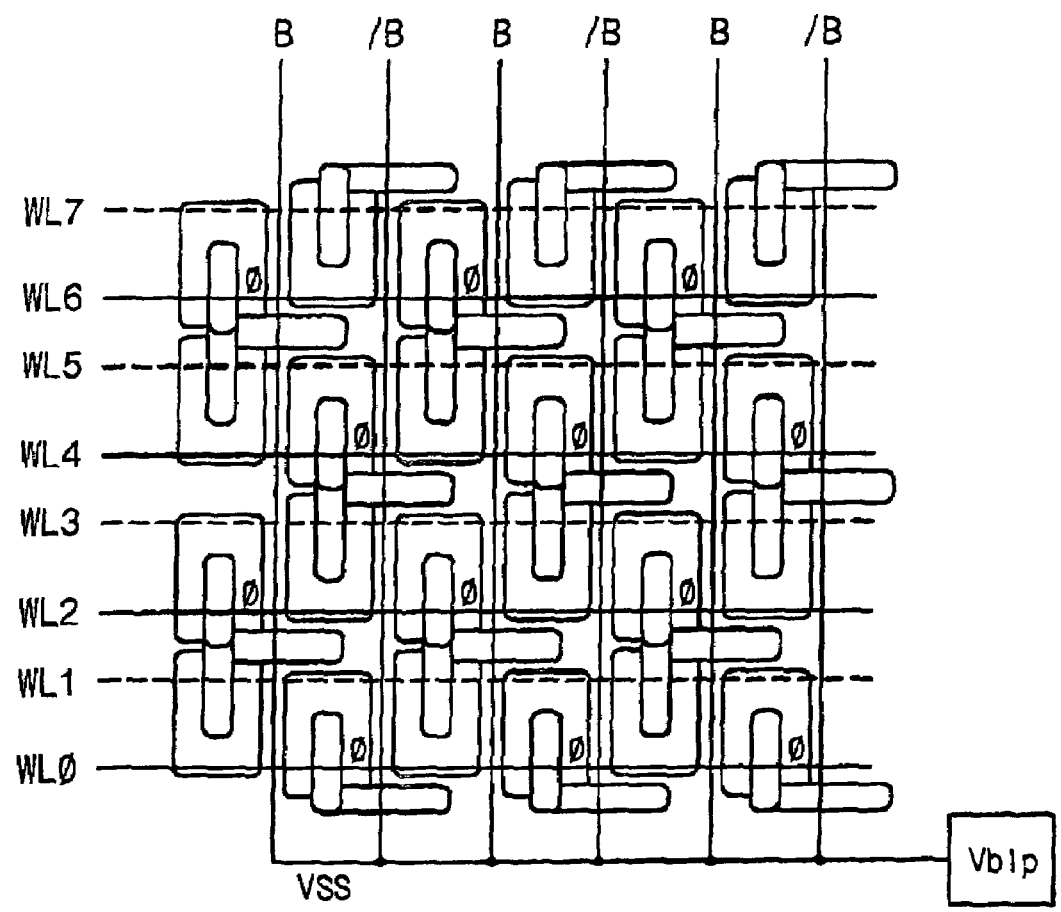
FIGS. 4–7 are circuit diagrams explaining a wordline driving mode in a conventional burn-in stress apparatus.
Figure 5:
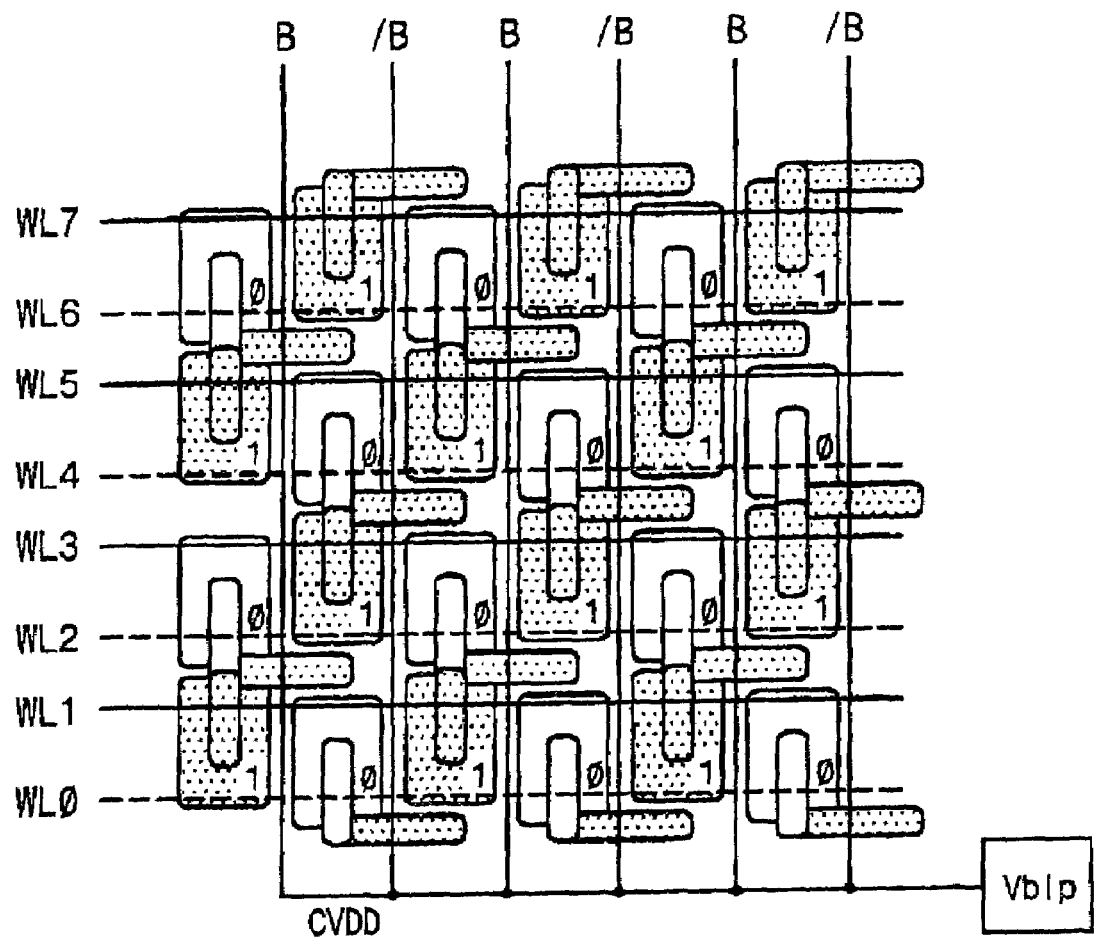
Figure 6:
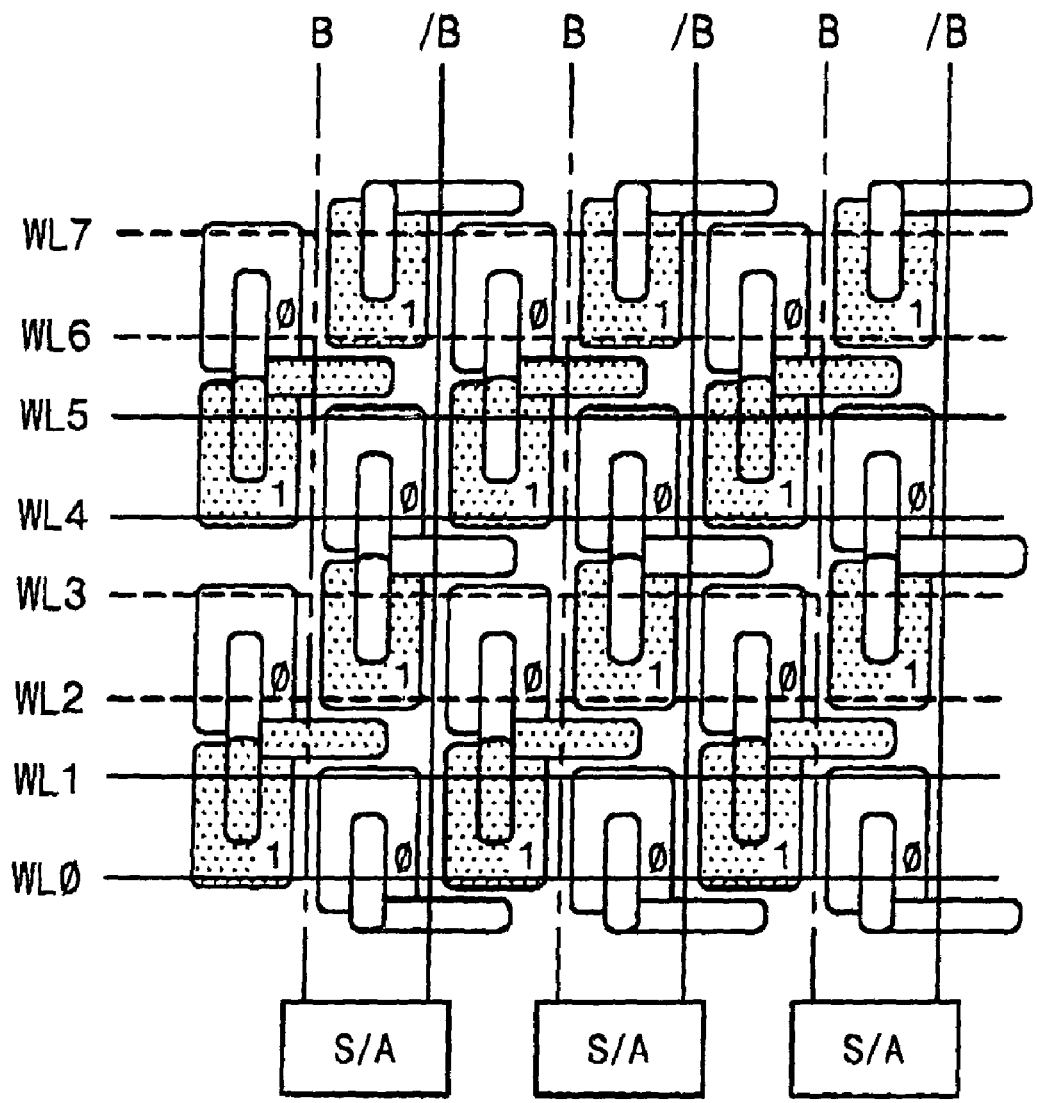
Figure 7:
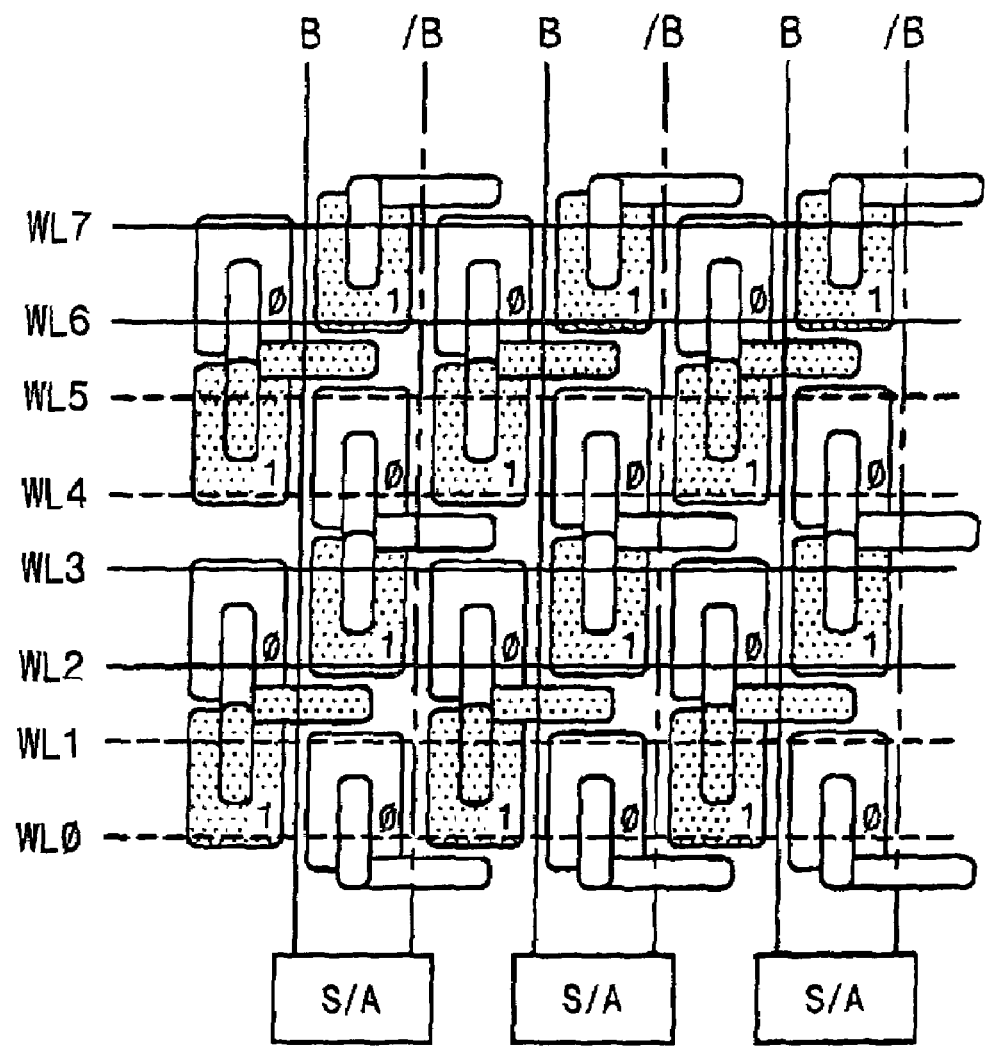
Figure 8:
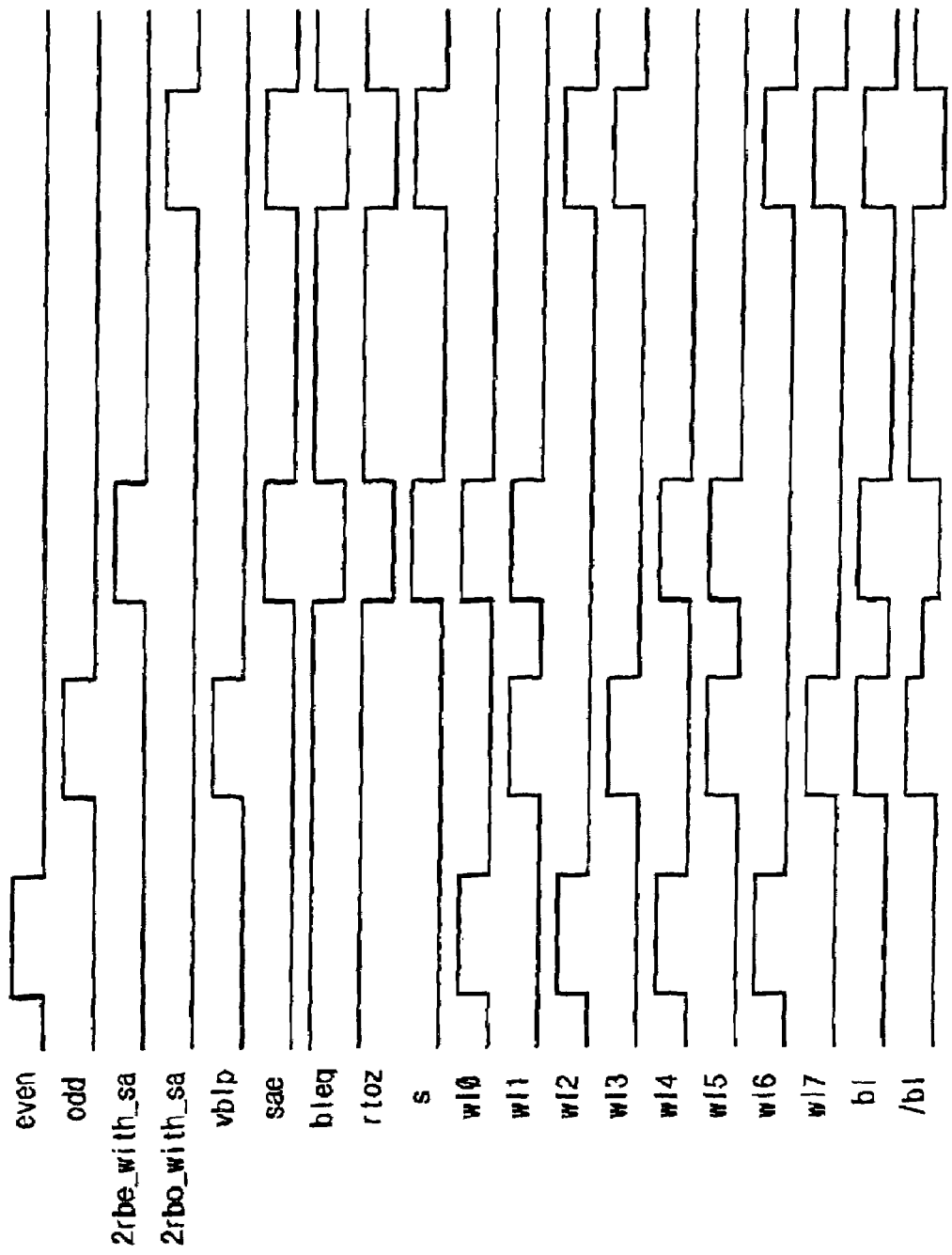
FIG. 8 is a timing diagram illustrating a conventional operating pattern.

The disclosed apparatus is described in detail with reference to accompanying drawings, in which like reference numerals are used to identify the same or similar parts.

Figure 9:
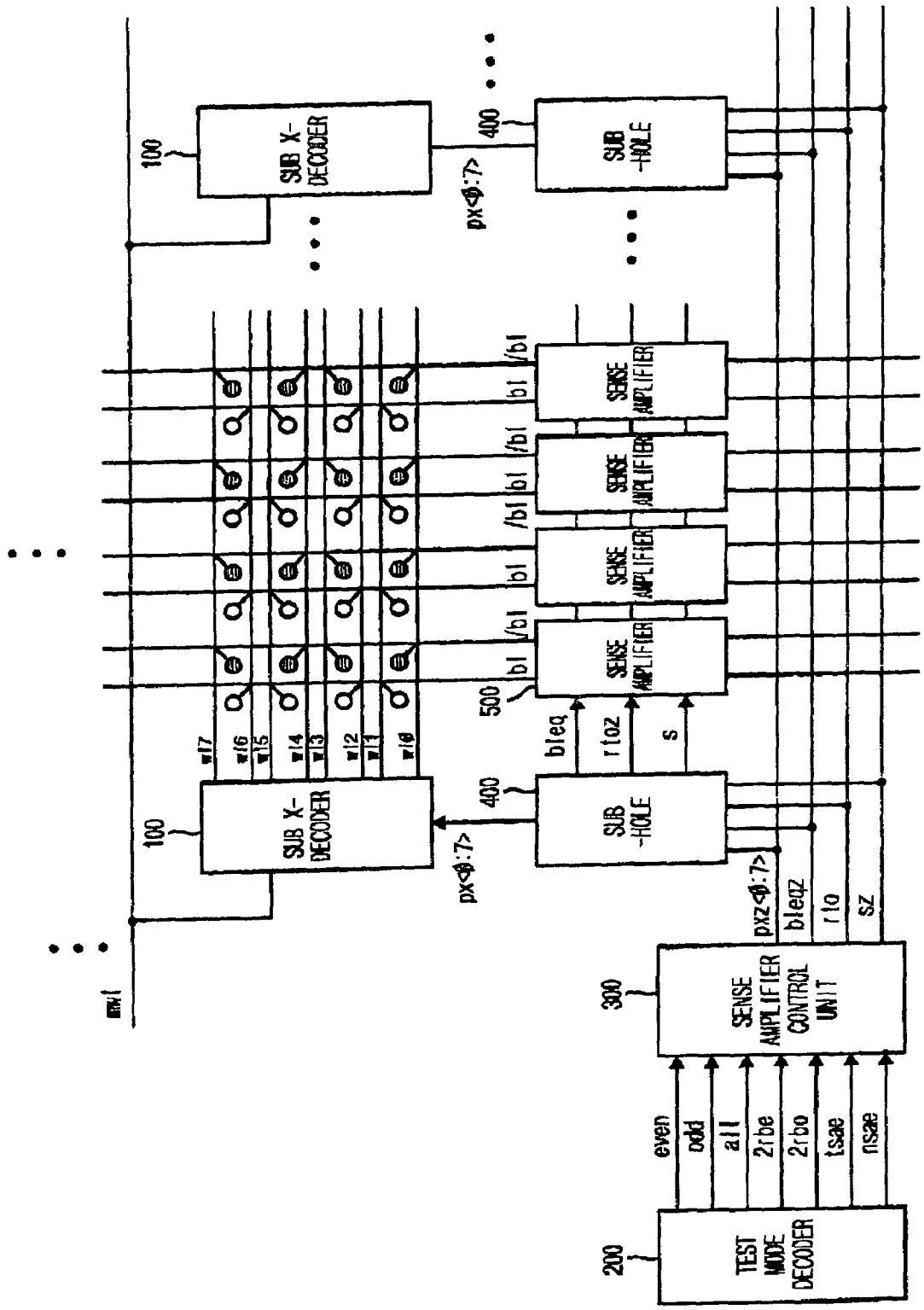
FIG. 9 is a block diagram illustrating a semiconductor memory test device.

FIG. 9 is a block diagram illustrating a semiconductor memory test device. The semiconductor memory test device includes a sub X-decoder 100, a test mode decoder 200, a sense amplifier control unit 300, a sub-hole 400 and a sense amplifier 500.

A main wordline mwl is connected to the sub X-decoder 100. The sub X-decoder 100 is connected to a plurality of sub-wordlines wl0-wl7. The sub-hole 400 outputs eight wordline driver driving select signals (px<0:7>) to the sub X-decoder 100. The test mode decoder 200 decodes an inputted signal, and then outputs an even wordline driving signal (even), an odd wordline driving signal (odd), the entire wordline driving signal (all), wordline driving signals (2rbe and 2rbo), a sense amplifier driving signal (tsae), and a normal sense amplifier enable signal (nsae) to the sense amplifier control unit 300. The sense amplifier control unit 300 outputs an inverted wordline driver driving select signal (pxz<0:7>), an inverted bit line equalizer signal (bleqz), a sense amplifier pull-up driving signal (rto) and an inverted sense amplifier pull-down driving signal (sz) to the sub-hole 400, depending on each of the output signals of the test mode decoder 200. The plurality of the sense amplifiers 500 senses data applied to the bit line bl,/bl depending on a bit line equalizer signal (bleq), an inverted sense amplifier pull-up driving signal (rtoz) and the sense amplifier pull-down driving signals.

Figure 10:
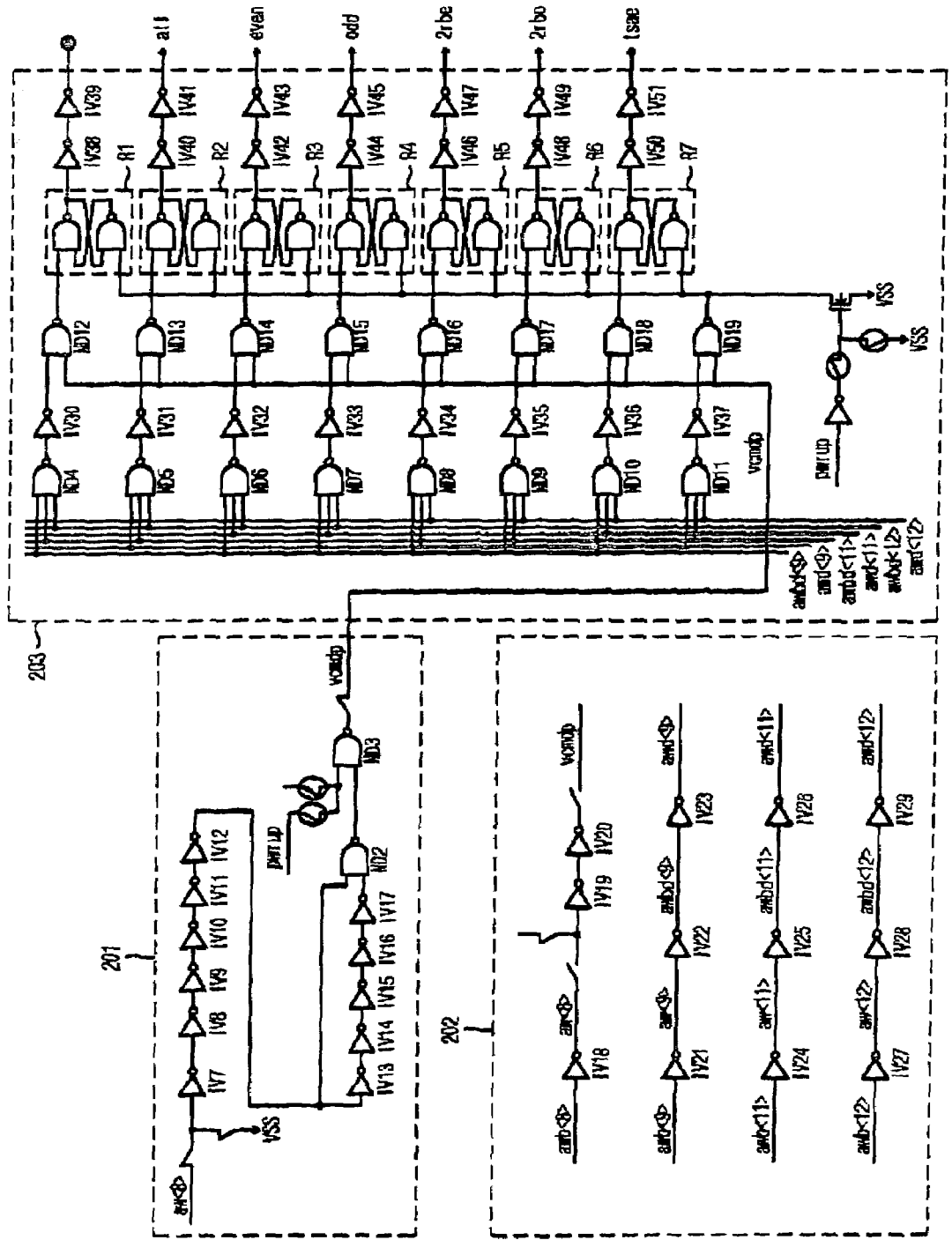
FIG. 10 is a detailed circuit diagram illustrating a test mode decoder in FIG. 9.

FIG. 10 is a detailed circuit diagram illustrating the test mode decoder 200 of FIG. 9. The test mode decoder 200 includes a signal generating unit 201, an address control unit 202 and a decoder 203.

The signal generating unit 201 delays an address signals (aw<8>) for a given period of time to produce a pulse generating signal (vcmdp). The address control unit 202 receives address signals (awb<9>, awb<11>and awb<12>), and outputs address signals (awd<9>, awd<11>and awd<12>). The decoder 203 decodes the address signals (awbd<9>, awd<9>, awbd<11>, awd<11>, awbd<12>and awd<12>) and the pulse generating signal (vcmdp) to produce the even wordline driving signal (even), the odd wordline driving signal (odd), the entire wordline driving signal (all), wordline driving signals (2rbe, 2rbo) every two, and the sense amplifier driving signal (tsae). The address signals (awb<8>-awb<12>) is an externally inputted address signals, and may be internally generated signals in the other embodiment.

The signal generating unit 201 includes inverters IV7–IV12 for delaying an inputted address signal (aw<8>), inverters IV13–IV17 for inverting/delaying the output of the inverter IV12, a NAND gate ND2 for performing a NAND logic function on the output of the inverter IV12 and the output of the inverter IV17, and a NAND gate ND3 for NANDing the output of the NAND gate ND2 and an inputted power-up signal (pwrup) and outputting a pulse generating signal (vcmdp).

Also, the address control unit 202 includes inverters IV18–IV20 for inverting/delaying the address signal (awb<9>) to produce the address signal (awd<9>), inverters IV24–IV26 for inverting/delaying the address signal (awb<11>) to produce the address signal (awd<9>), and inverters IV27–IV29 for inverting/delaying the address signal (awb<12>) to produce an address signal (awd<12>).

Further, the decoder 203 includes NAND gates ND4–ND11 for NANDing the address signals (awbd<9>, awd<9>, awbd<11>, awd<11>, awbd<12>and awd<12>), inverters IV30–IV37 for inverting the outputs of the NAND gates ND4–ND11, respectively, NAND gates ND12–ND19 for NANDing the outputs of the inverters IV30–IV37 and the pulse generating signal (vcmdp), respectively, latches R1–R7 for latching the outputs of the NAND gates ND12–ND19 and the power-up signal (pwrup), respectively, and inverters IV38–IV51 for delaying the outputs of the latches R1–4R7 to produce the even wordline driving signal (even), the odd wordline driving signal (odd), the whole wordline driving signal (all), the wordline driving signals (2rbe, 2rbo), and the sense amplifier driving signal (tsae).

Figure 11:
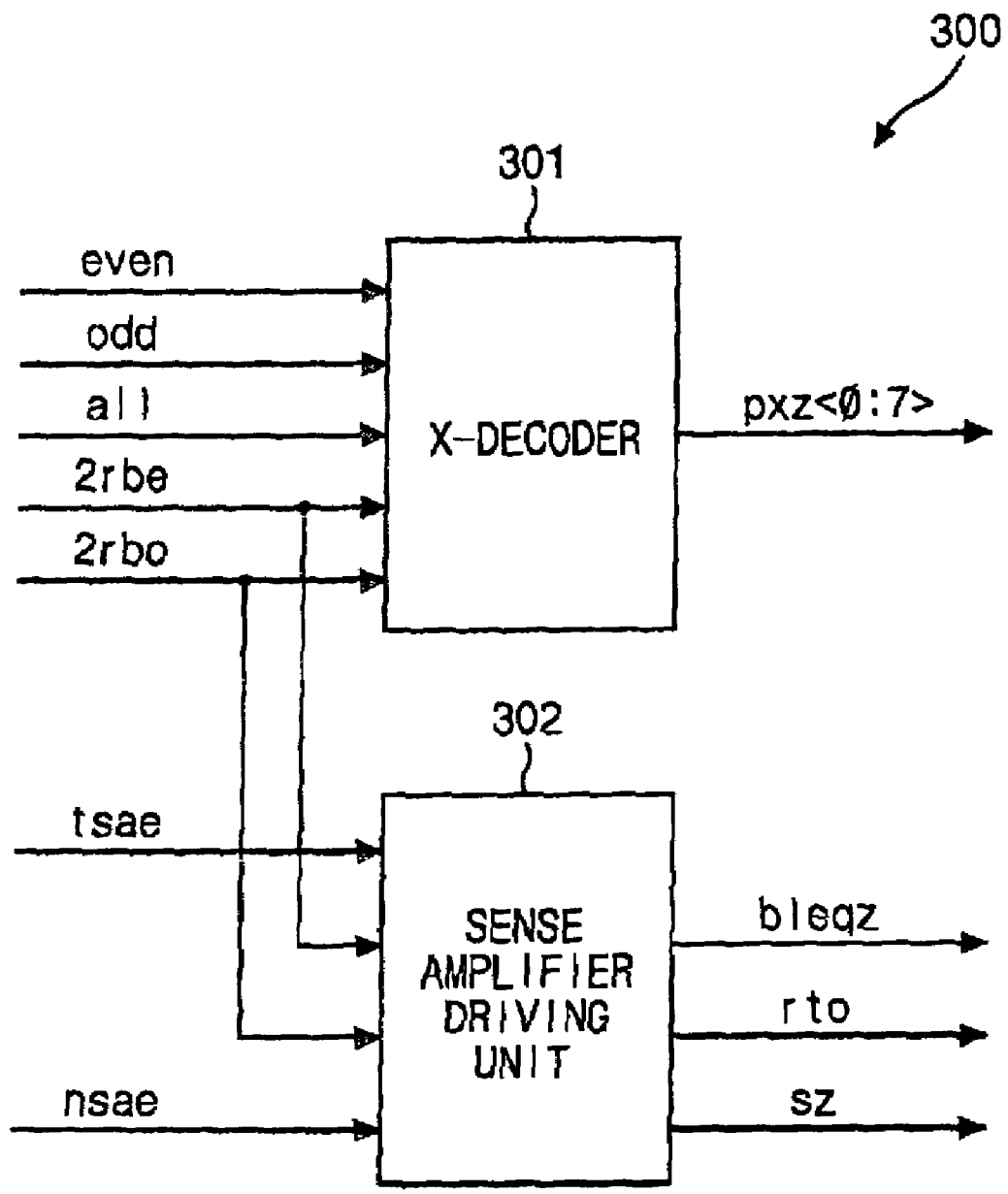
FIG. 11 is a detailed circuit diagram illustrating a sense amplifier control unit in FIG. 9.

FIG. 11 is a detailed circuit diagram illustrating the sense amplifier control unit 300 of FIG. 9. The X-decoder 301 decodes the even wordline driving signal (even), the odd wordline driving signal (odd), the whole wordline driving signal (all) and the wordline driving signals (2rbe and 2rbo) and outputs the inverted wordline driver driving select signal (pxz<0:7>) to the sub-hole 400. Also, the sense amplifier driving unit 302 outputs the inverted bit line equalizer signal (bleqz), the sense amplifier pull-up driving signal (rto) and the inverted sense amplifier pull-down driving signal (sz), for controlling the sense amplifier 500, to the sub-hole 400, depending on the wordline driving signals (2rbe and 2rbo), the normal sense amplifier enable signal (nsae) and the sense amplifier driving signal (tsae).

Figure 12:
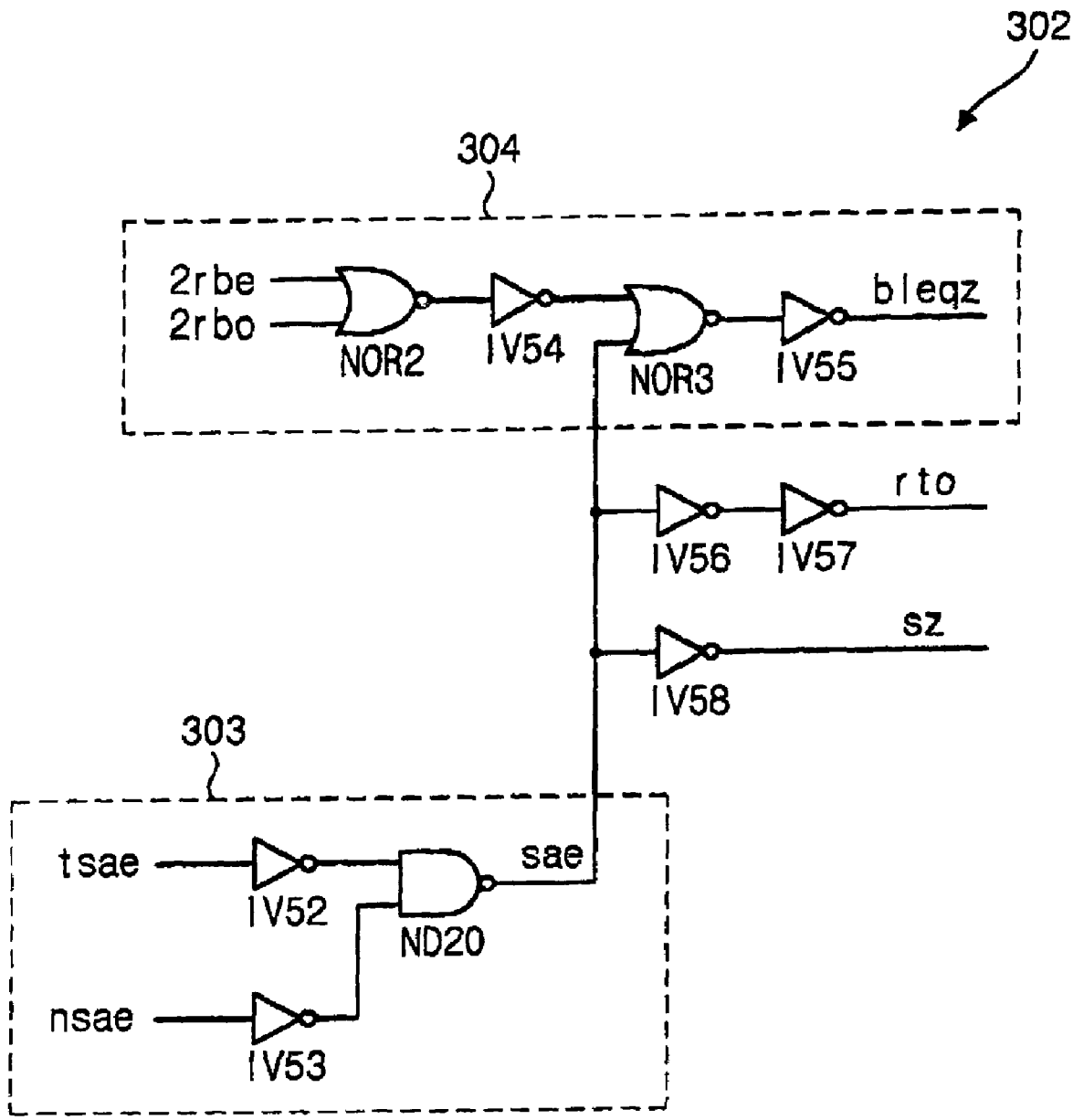
FIG. 12 a detailed circuit diagram illustrating a sense amplifier-driving unit in FIG. 11.

FIG. 12 a detailed circuit diagram of the sense amplifier-driving unit 302 of FIG. 11. The sense amplifier driving unit 302 includes a first signal generating unit 303 and a second signal generating unit 304. The first signal generating unit 303 includes an inverter IV52 for inverting the sense amplifier driving signal (tsae), an inverter IV53 for inverting the normal sense amplifier enable signal (nsae), and a NAND gate ND20 for NANDing the sense amplifier driving signal (tsae) and the normal sense amplifier enable signal nsae inverted through the inverter IV52 and the inverter IV53 to produce the sense amplifier driving signal (sae). Also, the second signal generating unit 304 includes a NOR gate NOR2 for NORing the wordline driving signals (2rbe and 2rbo), an inverter IV54 for inverting the output of the NOR gate NOR2, a NOR gate NOR3 for NORing the output signal of the inverter IV54 and the sense amplifier driving signal (sae), and an inverter IV55 for inverting the output of the NOR gate NOR3 to produce the inverted bit line equalizer signal (bleqz). Also, the sense amplifier driving unit 302 further includes inverters IV56 and IV57 for delaying the sense amplifier driving signal (sae) to produce the sense amplifier pull-up driving signal (rto), and an inverter IV58 for inverting the sense amplifier driving signal (sae) to produce the sense amplifier pull-down driving signal (sz).

The operation of the semiconductor memory test device having this structure is described with reference to FIGS. 13–15.

First, when the sense amplifier driving signal (sae) is disabled, the sense amplifier pull-up driving signal (rto) becomes HIGH, the inverted sense amplifier pull-down driving signal (sz) becomes LOW, and the bit line precharge signal (blp) and the bit line equalizer signal (bleq) become HIGH. At this time, the even (0, 2, 4, 6) wordlines WL0, WL2, WL4 and WL6 are selected and the bit line precharge voltage (Vblp) becomes LOW.

Next, after the odd wordlines WL0, WL2, WL4 and WL6 are disabled, the odd (1, 3, 5, 7) wordlines WL1, W13, WL5 and WL7 are selected and the bit line precharge voltage (Vblp) becomes HIGH.

Figure 13:
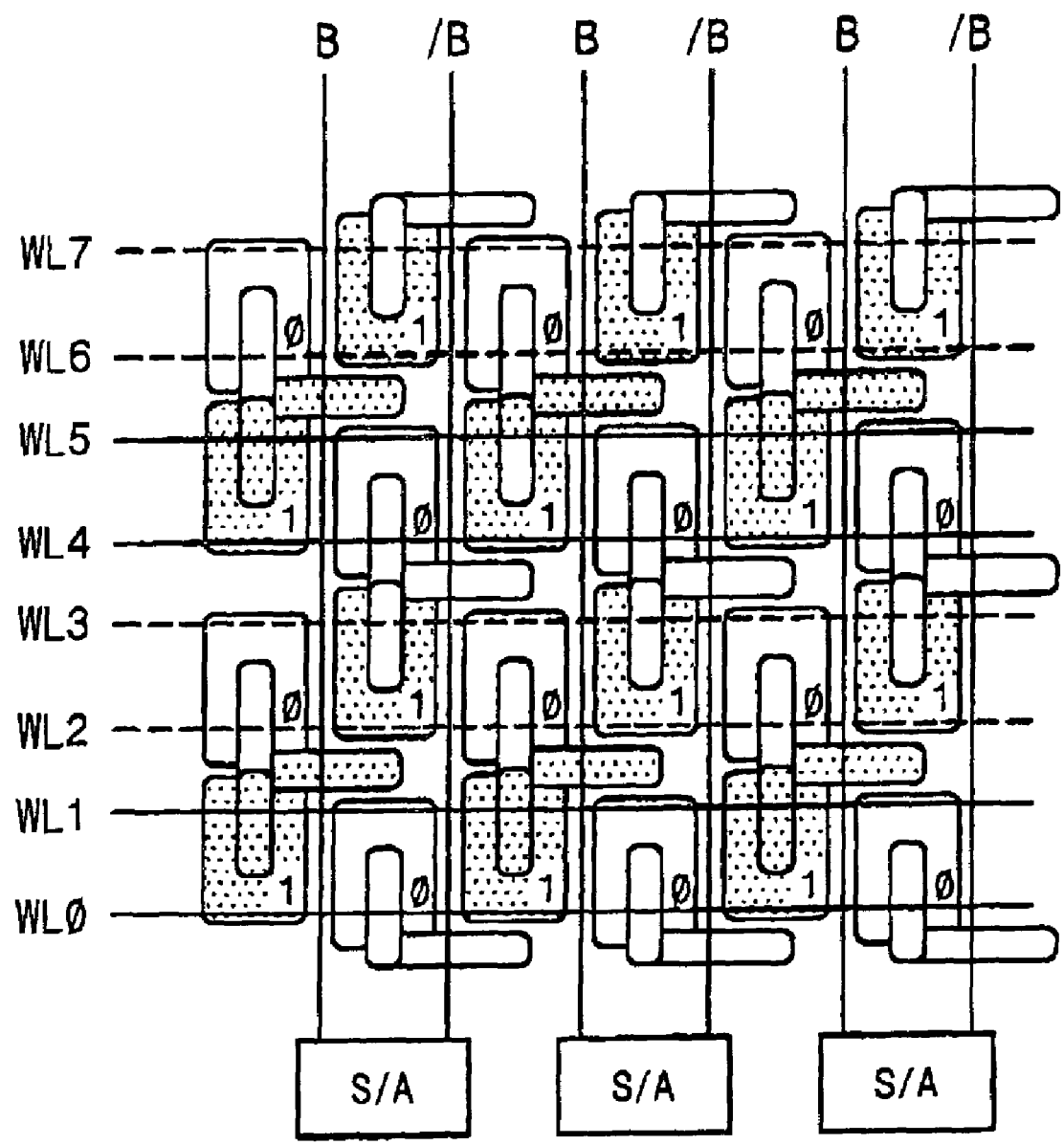
FIGS. 13–15 are circuit diagrams explaining a wordline driving mode.

As shown in FIG. 13, if the wordline driving signal (2rbe) is enabled, the bit lines bl,/bl become a high potential (cvdd) and a low potential (vss) by charge distribution, respectively. At this time, the sense amplifier 500 is not driven. The sense amplifier 500 is only driven when the sense amplifier driving signal (sae) is enabled.

Figure 14:
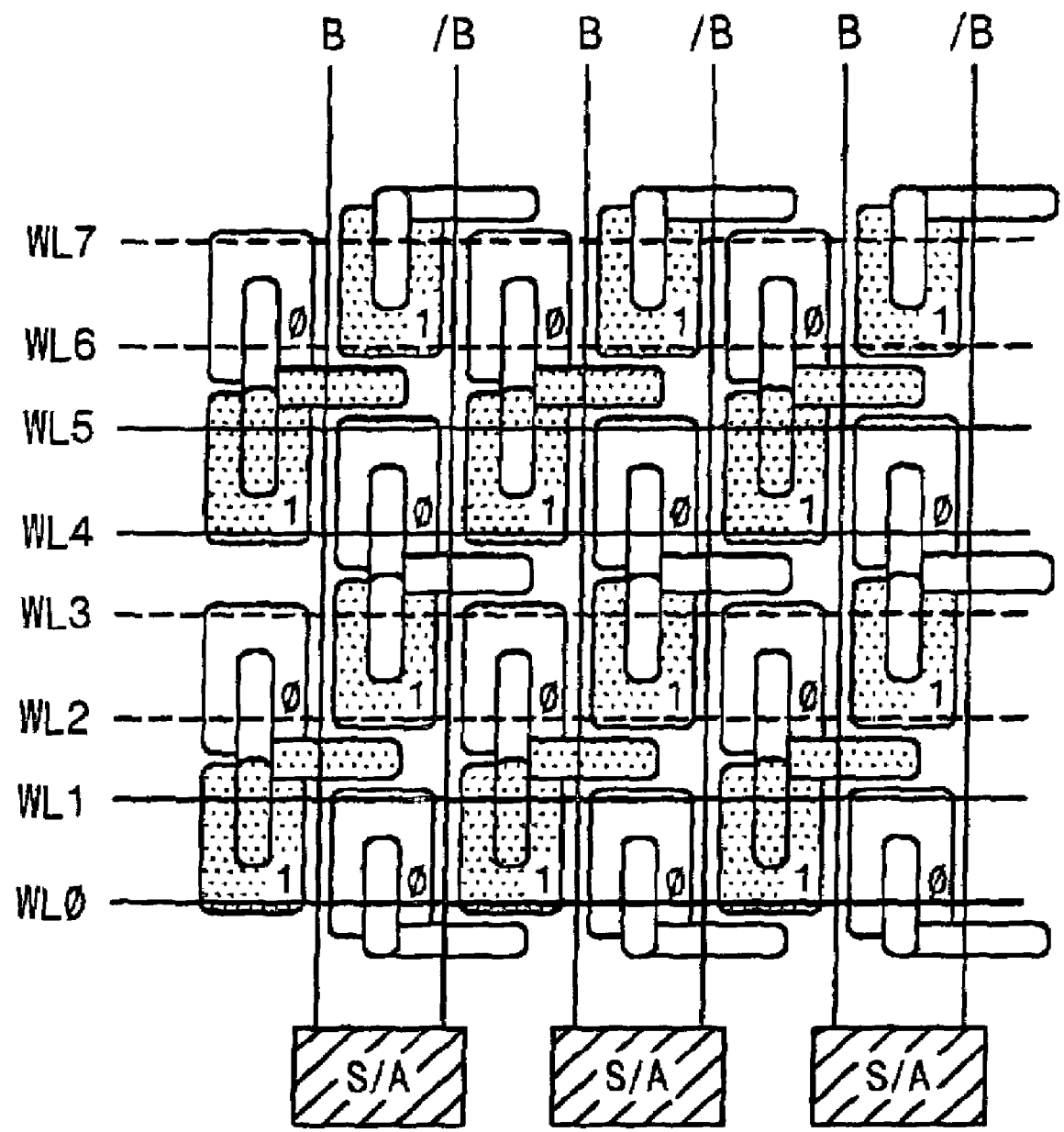

As shown in FIG. 14, if an additional sense amplifier driving signal (sae) is applied when the charge distribution of the bit lines bl,/bl is completed, the sense amplifier is enabled. Also, if the wordlines corresponding to the wordline driving signal (2rbe) are enabled, HIGH and LOW are applied to the bit lines bl,/bl of corresponding cell, respectively. At this time, HIGH and LOW are uniformly sequentially applied to the bit line B and the bit line bar /B by charge distribution.

Figure 15:
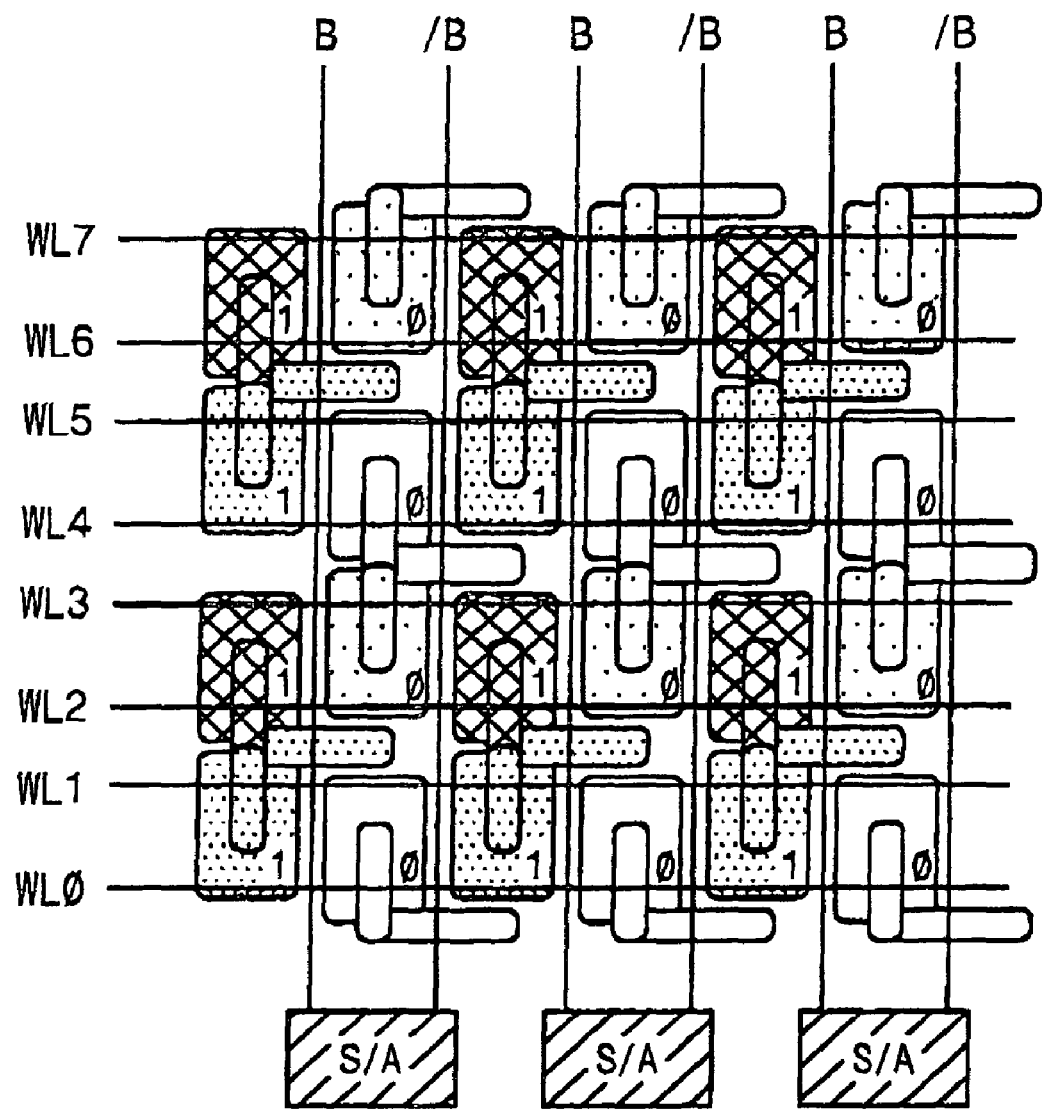

Then, as shown in FIG. 15, when sense amplifier is enabled, the wordlines WL2, WL3, WL6 and WL7 corresponding to the wordline driving signal 2rbo are enabled. At this time, the wordline driving signals (2rbe and 2rbo) are selected and data applied to the bit lines b,/b by the same sense amplifier are sensed, where in the data of a cell corresponding to the wordline driving signal (2rbo) is adversely written. Therefore, the data of a cell corresponding to the wordline driving signal (2rbe) and the data of a cell corresponding to the wordline driving signal (2rbo) do not collide.

Figure 16:
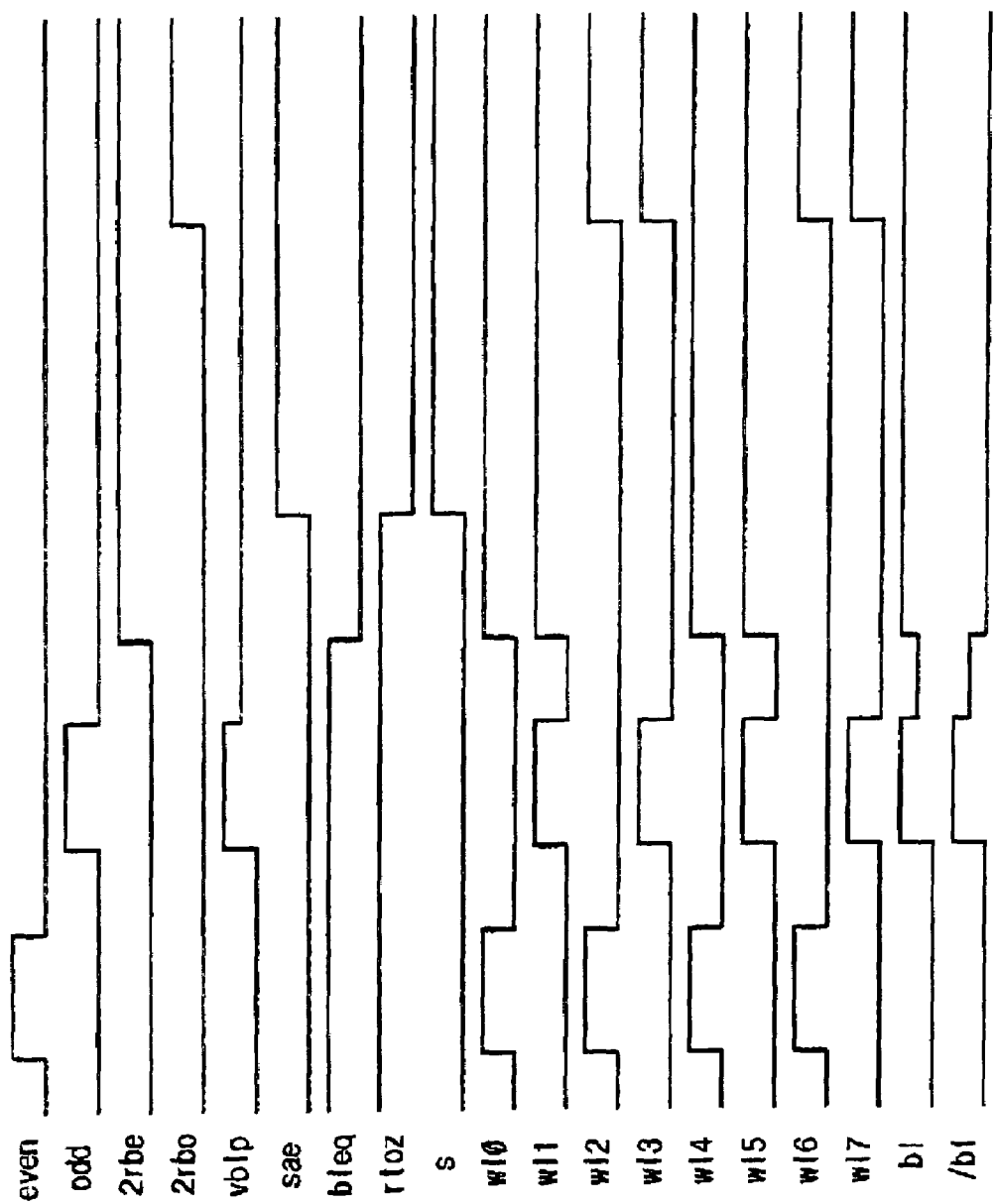
FIG. 16 is a timing diagram illustrating an operating pattern of the semiconductor memory test device.

An operating timing diagram of the disclosed semiconductor memory test device is shown in FIG. 16.

It should be noted that the above method is only one embodiment and the sequence in which the even wordlines and the odd wordlines are enabled or the sequence in which the wordline driving signals (2rbe and 2rbo) are enabled could be changed.

As mentioned above, the disclosed apparatus is advantageous in it can reduce the test time by controlling the bias of the entire cells using only the potential of the bit line at the sense amplifier and a stress application time. Further, the disclosed apparatus may reduce a region that is partially over-stressed or relatively under-stressed by uniformly applying a stress when a semiconductor memory is tested.

The disclosed device provides a semiconductor memory test device in which a constant supply voltage is applied to cells and snc corresponding to the entire wordlines to consistently apply a uniform stress to them. This technique stresses devices in the way a sense amplifier is controlled depending on an additional sense amplifier driving signal to enable all the wordlines and the sense amplifier drives bit lines bl, /bl with HIGH and LOW, respectively, when a 2rb pattern stress is applied.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A semiconductor memory test device, comprising:
    a test mode decoder for decoding an inputted address signal and outputting a wordline driving signal and a sense amplifier driving signal which is activated when charge distribution of a bitline is finished at a test mode;
    a decoder for decoding the wordline driving signal and output a selecting signal for controlling a corresponding wordline; and
    a sense amplifier driving unit for controlling a sense amplifier in response to the wordline driving signal and the sense amplifier driving signal to enable all wordlines while the sense amplifier is enabled.

2. The semiconductor memory test device according to claim 1, wherein said test mode decoder comprises:
    a signal generating unit for receiving the address signal to produce a first pulse signal;
    an address control unit for receiving inputted address signals; and
    a decoder for decoding a buffered address signal applied from the address control unit and the first pulse signal.

3. The semiconductor memory test device according to claim 2, wherein the signal generating unit comprises:

a pulse generator for receiving the address signal to produce a second pulse signal; and a first logic device for logically operating on the second pulse signal of said pulse generator and an inputted power-up signal to produce the first pulse signal.

4. The semiconductor memory test device according to claim 3, wherein said pulse generator comprises:

a first inverter chain for delaying the address signal;

a second inverter chain for delaying the output signal of said first inverter chain; and a second logic device for logically operating on the output signal of said first inverter chain and the output of said second inverter chain to produce the second pulse signal.

5. The semiconductor memory test device according to claim 1, wherein said sense amplifier driving unit comprises:

a first signal generating unit for logically operating on the sense amplifier driving signal and an inputted normal sense amplifier enable signal; and a second signal generating unit for logically operating on the wordline driving signal and the output of said first signal generating unit.

6. The semiconductor memory test device according to claim 5, wherein said sense amplifier driving unit comprises:

a first inverter for delaying the output signal of said first signal generating unit to produce the sense amplifier pull-up driving signal; and a second inverter for inverting/delaying the output signal of said first signal generating unit to produce an inverted sense amplifier pull-down driving signal.

7. The semiconductor memory test device according to claim 5, wherein the first signal generating unit comprises:

a first inverter for inverting the sense amplifier driving signal;

a second inverter for inverting the normal sense amplifier enable signal; and a third logic device for logically operating on the output signals of said first inverter and said second inverter.

8. The semiconductor memory test device according to claim 5, wherein said second signal generating unit comprises:

a fourth logic device for logically operating on the wordline driving signal;

a third inverter for inverting the output of said fourth logic device;

a fifth logic device for logically operating on the output signals of said third inverter and an output signal of said first signal generating unit; and a fourth inverter for inverting the output of said fifth logic device to produce an inverted bit line equalizer signal.

9. A semiconductor memory test device, comprising:

a test mode decoder for decoding inputted address signals to produce a wordline driving signal and a sense amplifier driving signal;

a sense amplifier control unit for decoding the wordline driving signal to produce a wordline driver driving select signal, and enabling all wordlines when said sense amplifier is enabled, depending on said sense amplifier driving signal;

a sub-hole for inverting the wordline driver driving select signal and a sense amplifier control signal;

a sub X-decoder for enabling a selected wordline depending on the wordline driver driving select signal; and a sense amplifier enabled depending on the sense amplifier control signal.

* * * * *